US010921066B2

(12) United States Patent
Wang

(10) Patent No.: US 10,921,066 B2
(45) Date of Patent: Feb. 16, 2021

(54) ENHANCED HEAT DISSIPATION MODULE, COOLING FIN STRUCTURE AND STAMPING METHOD THEREOF

(71) Applicant: GETAC TECHNOLOGY CORPORATION, Hsinchu County (TW)

(72) Inventor: Chen-Ping Wang, Taipei (TW)

(73) Assignee: GETAC TECHNOLOGY CORPORATION, Hsinchu County (TW)

(*) Notice: Subject to any disclaimer, the term of this patent is extended or adjusted under 35 U.S.C. 154(b) by 32 days.

(21) Appl. No.: 16/017,984

(22) Filed: Jun. 25, 2018

(65) Prior Publication Data

US 2019/0390922 A1 Dec. 26, 2019

(51) Int. Cl.
| | |
|---|---|
| *F28F 3/06* | (2006.01) |
| *H01L 23/367* | (2006.01) |
| *F28F 1/12* | (2006.01) |
| *F28F 3/02* | (2006.01) |
| *F28F 3/04* | (2006.01) |

(Continued)

(52) U.S. Cl.
CPC ............... *F28F 3/06* (2013.01); *B21D 22/02* (2013.01); *B21D 53/022* (2013.01); *F28F 1/128* (2013.01); *F28F 3/02* (2013.01); *F28F 3/027* (2013.01); *F28F 3/042* (2013.01); *F28F 2215/08* (2013.01); *F28F 2215/10* (2013.01); *H01L 23/3672* (2013.01)

(58) Field of Classification Search
CPC .... F28F 2215/08; F28F 2215/10; F28F 1/128; F28F 3/02; F28F 3/027; F28F 3/042; H01L 23/3672

USPC ...................................................... 165/80.3
See application file for complete search history.

(56) References Cited

U.S. PATENT DOCUMENTS 5,002,123 A * 3/1991 Nelson ...................... F28F 3/02
165/147
5,653,285 A * 8/1997 Lee ........................... F28F 3/02
165/185

(Continued)

FOREIGN PATENT DOCUMENTS

| | | |
|---|---|---|
| CN | 1332355 A | 1/2002 |
| JP | S61243287 A * | 10/1986 |

(Continued)

OTHER PUBLICATIONS

Translation of Japanese Patent Document JP 62112997 A entitled Translation—JP 62112997 A (Year: 2019).*

(Continued)

*Primary Examiner* — Paul Alvare

(57) ABSTRACT

The present invention relates to an enhanced heat dissipation module, a cooling fin structure and a stamping method thereof. The enhanced heat dissipation module includes a first cooling fin and a second cooling fin. The first cooling fin includes a first tapered tunnel protruding outwards, and the second cooling fin includes a second tapered tunnel protruding outwards. The first tapered tunnel and the second tapered tunnel jointly encircle and form a flow guide channel. Accordingly, a pressure difference is generated by hot air passing through the tapered tunnels, thereby increasing natural thermal convection and further enhancing heat dissipation efficiency of the cooling fins.

2 Claims, 14 Drawing Sheets

(51) Int. Cl.
*B21D 53/02* (2006.01)
*B21D 22/02* (2006.01)

(56) References Cited

U.S. PATENT DOCUMENTS

| | | | | |
|---|---|---|---|---|
| 5,697,432 | A * | 12/1997 | Yun | F28F 1/325 165/151 |
| 5,738,168 | A * | 4/1998 | Patel | F28F 1/325 165/151 |
| 6,026,893 | A * | 2/2000 | Jung | F28F 1/325 165/151 |
| 6,227,289 | B1 * | 5/2001 | Yokoyama | F28F 1/325 165/151 |
| 6,364,009 | B1 * | 4/2002 | MacManus | H01L 23/367 165/185 |
| 8,490,680 | B2 * | 7/2013 | Shen | F28F 1/325 165/109.1 |
| 2001/0027857 | A1 * | 10/2001 | Emrich | F02B 29/0456 165/109.1 |
| 2002/0003035 | A1 * | 1/2002 | Oh | F28F 1/325 165/151 |
| 2005/0190538 | A1 * | 9/2005 | Huang | F28F 3/02 361/697 |
| 2008/0017349 | A1 * | 1/2008 | Li | H01L 23/3672 165/80.3 |
| 2008/0023176 | A1 * | 1/2008 | Peng | F04D 29/582 165/80.3 |
| 2009/0321049 | A1 * | 12/2009 | Chen | H01L 23/3672 165/80.3 |
| 2010/0294473 | A1 * | 11/2010 | Kameda | B21D 53/04 165/181 |
| 2011/0094258 | A1 * | 4/2011 | Lee | F28D 1/0478 62/498 |

FOREIGN PATENT DOCUMENTS

| | | | | |
|---|---|---|---|---|
| JP | 62112997 | A | * 5/1987 | |
| JP | 2009236469 | A | * 10/2009 | F28F 1/32 |

OTHER PUBLICATIONS

Translation of Japanese Patent Document JP 2009236469 A entitled Translation—JP 2009236469 A (Year: 2019).*
Translation of JPS61243287A entitled Translation—JPS61243287A (Year: 2020).*

* cited by examiner

ENHANCED HEAT DISSIPATION MODULE, COOLING FIN STRUCTURE AND STAMPING METHOD THEREOF

BACKGROUND OF THE INVENTION

Field of the Invention

The present invention relates to a heat dissipation structure and, more particularly, to an enhanced heat dissipation module, a cooling fin structure and a stamping method thereof.

Description of the Prior Art

Heat dissipation is heat exchange performed based on heat transfer. There are three heat transfer mechanisms—thermal conduction, thermal convection and thermal radiation. Cooling fins of a laptop computer dissipate heat primarily through thermal radiation, and a fan is used to enforce thermal convection for further heat dissipation.

However, to maximize heat dissipation performance of radiation, surfaces of current cooling fins are frequently clad by highly polymeric nanomaterial carbon or nanomaterial graphene. However, the above methods provide limited heat dissipation performance. Therefore, how to improve the structure of cooling fins to accordingly enhance heat dissipation performance is one of the main research and development goals.

In view of the above, with respect to the above prior art, as an object of the Applicant, the Applicant has dedicated to related researches incorporating with the application of theories to resolve the foregoing issues.

SUMMARY OF THE INVENTION

The present invention provides an enhanced heat dissipation module, a cooling fin structure and a stamping method thereof. By using a pressure difference generated by hot air passing through a tapered tunnel, natural thermal convection is increased to accordingly enhance heat dissipation efficiency of cooling fins.

A cooling fin structure is provided according to one embodiment of the present invention. The cooling fin structure of the present invention includes a cooling fin having at least one tapered tunnel protruding outwards.

An enhanced heat dissipation module is provided according to an embodiment of the present invention. The enhanced heat dissipation module includes a first cooling fin having at least one first tapered tunnel protruding outwards; and a second cooling fin having at least one second tapered tunnel protruding outwards. The first tapered tunnel and the second tapered tunnel jointly encircle and form a flow guide channel.

A stamping method for a cooling fin structure is provided according to an embodiment of the present invention. The stamping method includes performing a slit cutting operation or an impression stamping operation to cut two slits substantially parallel to each other on a cooling pin; and providing a stamping mechanism, the stamping mechanism performing stamping on an area between the two corresponding slits until the area between the two slits becomes deformed and forms a tapered tunnel and the two slits become deformed and form two through openings respectively at front and back ends of the tapered tunnel.

Based on the above, the surface area of the tapered tunnel is approximately 10% of that of the cooling fin, providing the cooling fin structure with a greater surface area for heat dissipation, and enabling the surface of the cooling fin to enhance heat dissipation performance of thermal radiation without involving additional coating material.

DETAILED DESCRIPTION OF THE EMBODIMENTS

Details and technical contents of the present invention are described in conjunction with the accompanying drawings below. These drawings are for illustration purposes only, and are not to be construed as limitations to the present invention.

Figure 1:
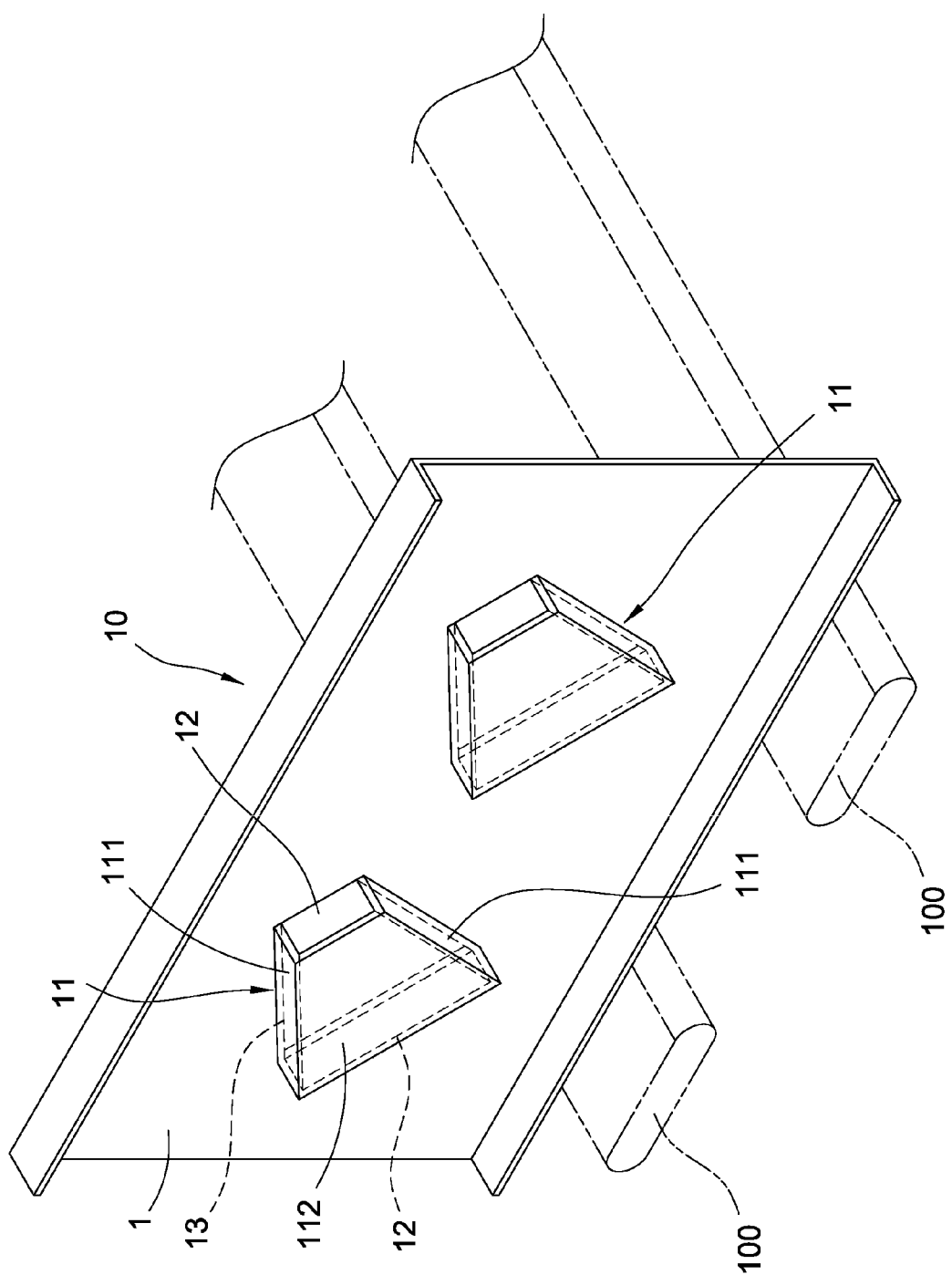
FIG. 1 is a schematic perspective view of a cooling fin structure according to the first embodiment of the present invention.
Figure 2:
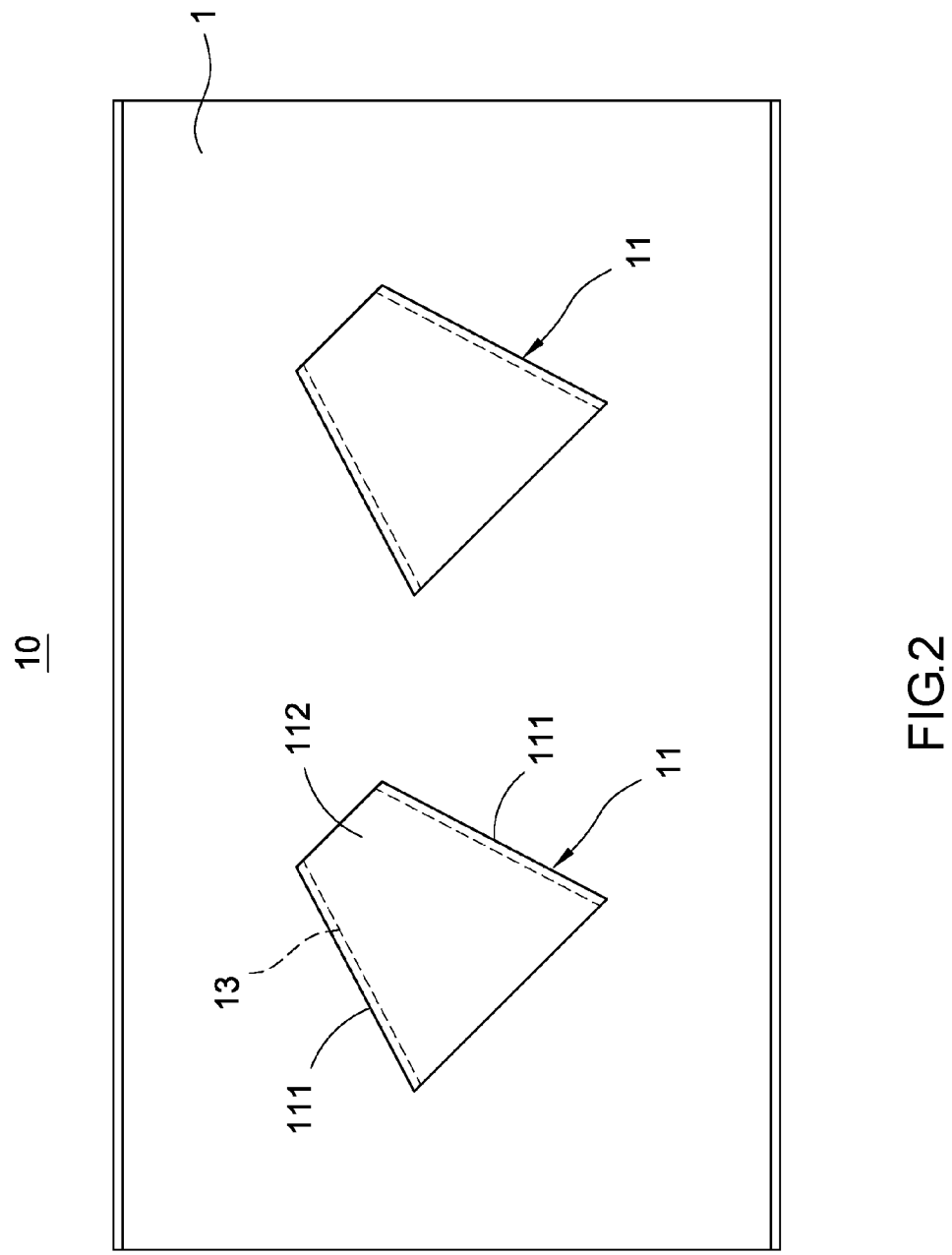
FIG. 2 is a schematic front view of the cooling fin structure according to the first embodiment of the present invention.
Figure 3:
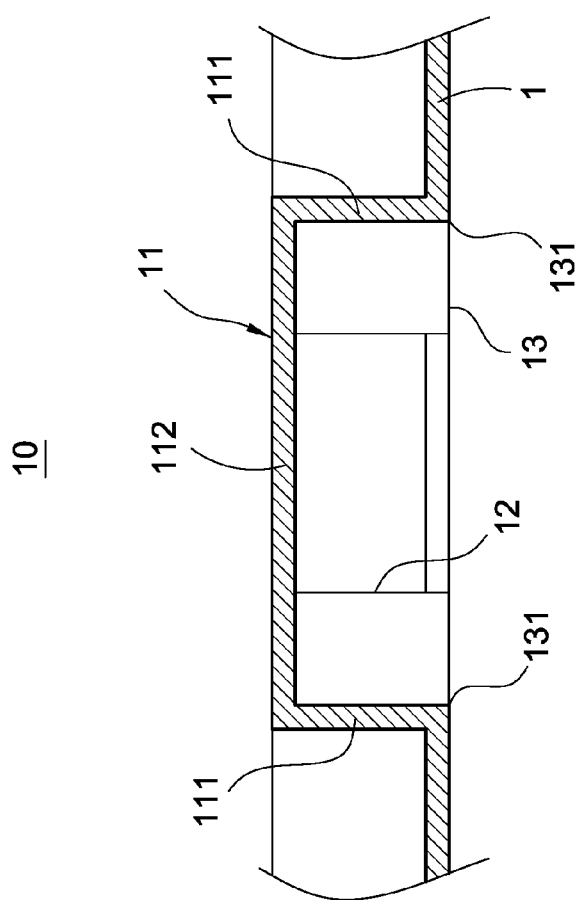
FIG. 3 is a schematic section view of the cooling fin structure according to the first embodiment of the present invention.

FIG. 1 to FIG. 3 show a cooling fin structure 10 according to the first embodiment of the present invention. Referring to FIG. 1 to FIG. 3, the cooling fin structure 10 primarily includes a cooling fin 1.

As shown in FIG. 1, a lower side of the cooling fin 1 is in thermal contact with a heat source 100, and includes one or more tapered tunnels 11 protruding outwards. Two through openings 12 are present at front and back ends of the tapered tunnel 11, and an opening of the tapered tunnel 11 gradually decreases towards a direction away from the heat source 100, such that an aperture of one of the through openings 12 is greater than an aperture of the other through opening 12.

Details are given with reference to FIG. 1 to FIG. 3 below. The tapered tunnel 11 has two side walls 111 and an upper wall 112. The upper wall 112 extends integrally and bridges the two side walls 111, such that a cross section of the tapered tunnel 11 appears inverted U-shaped. A distance between the two side walls 111 towards a direction away from the heat source 100 gradually reduces, in a way that the tapered tunnel 11 appears as a trapezoidal tunnel.

Further, the cooling fin 1 is provided with one or more windows 13, each of which has two opposite sides 131. The two side walls 111 of the tapered tunnel 11 integrally extend outwards from the two sides 131 of the window 13. The upper wall 112 correspondingly covers the window 13.

As shown in FIG. 1, in a use state of the cooling fin structure 10 of the present invention, the heat source 100 is in thermal contact with a lower part of the cooling fin 1, the cooling fin 1 includes the tapered tunnel 11 protruding outwards, and the opening of the tapered tunnel 11 decreases towards a direction away from the heat source 100, such that the aperture of the through opening 12 configured below is greater than the aperture of the through opening 12 configured above. Accordingly, when hot air passes upwards through the tapered tunnel 11, pressure is increased as the flow speed decreases, or pressure is decreased as the flow speed increases. Thus, the aperture of the through opening 12 configured below is greater than the aperture of the through opening 12 configured above, in a way that the pressure below is greater than the pressure above as an "air pump" and a pressure difference is generated, and high temperature moves towards low temperature, thereby enhancing natural thermal convection, and achieving enhanced heat dissipation efficiency of the cooling fin structure 10.

Furthermore, the surface area of the tapered tunnel 11 is approximately 10% of the cooling fin 1, providing the cooling fin structure 10 with more surface area for heat dissipation, and enabling the surface of the cooling fin 1 to enhance heat dissipation performance of thermal radiation without involving additional coating material.

Figure 4:
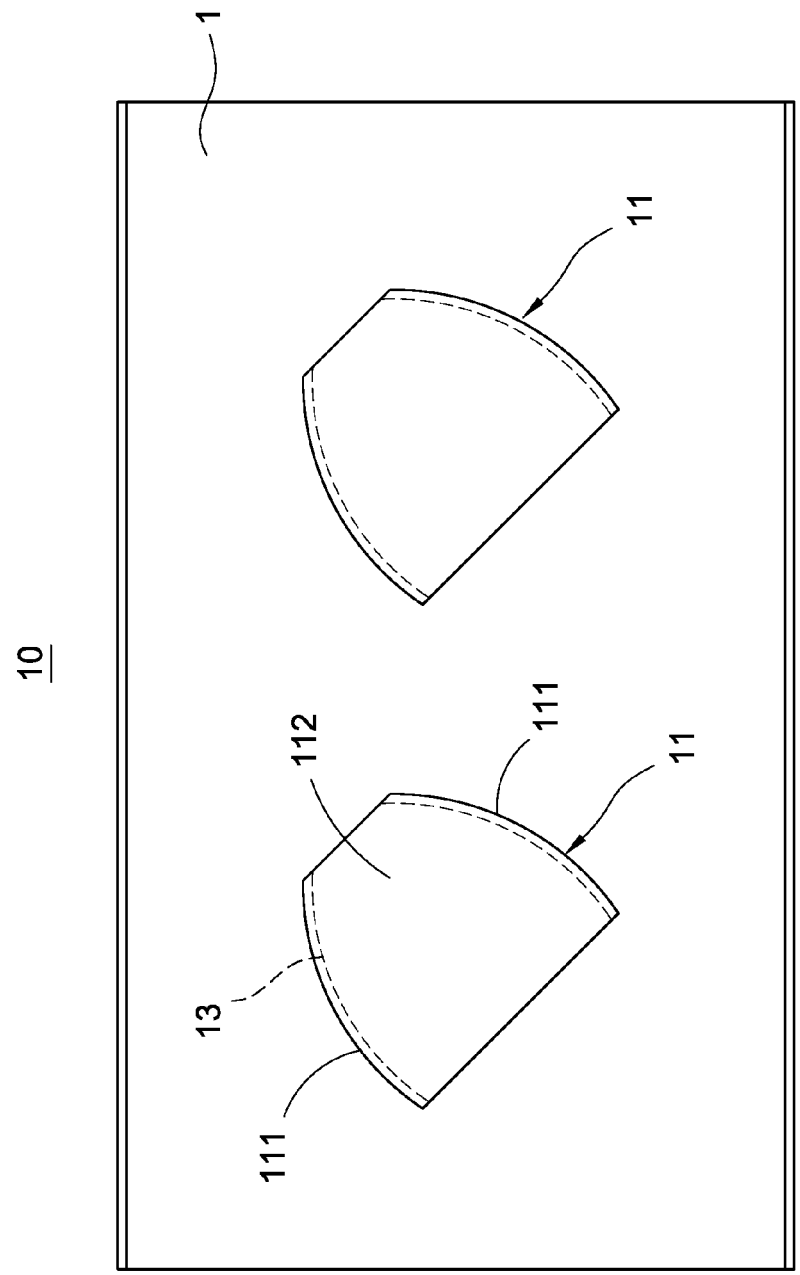
FIG. 4 is a schematic front view of the cooling fin structure according to the second embodiment of the present invention.
Figure 5:
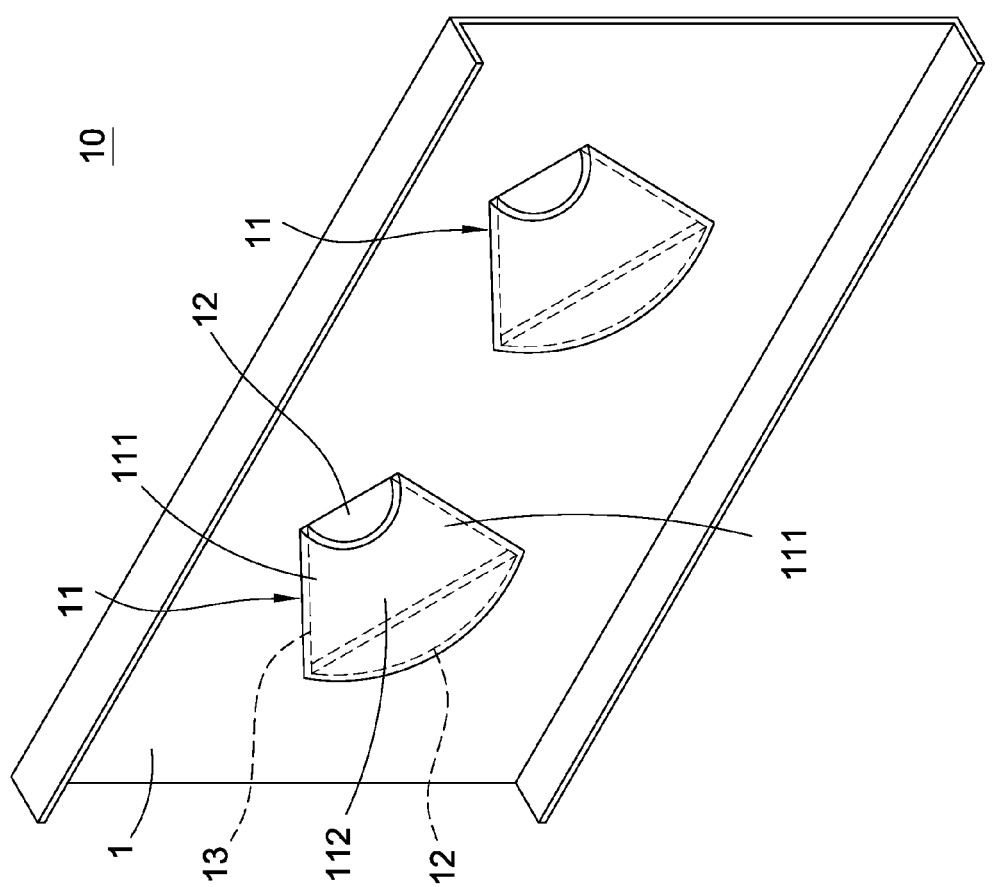
FIG. 5 is a schematic perspective view of the cooling fin structure according to the third embodiment of the present invention.

FIG. 4 and FIG. 5 show the cooling fin structure 10 according to the second and third embodiments of the present invention. Referring to FIG. 4 and FIG. 5, the second and third embodiments are substantially the same as the first embodiment, and differ from the first embodiment in that the tapered tunnel 11 has a different shape.

Further description is given below. As shown in FIG. 4, a distance between the two side walls 111 in the second embodiment gradually reduces towards a direction away from the heat source 100, such that the tapered tunnel 11 appears as a semi-ellipsoidal tunnel. As shown in FIG. 5, the tapered tunnel 11 in the third embodiment has two side walls 111 and an upper wall 112, with the upper wall 112 extending integrally and bridging the two side walls 111, such that a cross section of the tapered tunnel 11 appears U-shaped. Regardless of whether the tapered tunnel 11 appears as a trapezoidal tunnel or a semi-ellipsoidal tunnel, or whether the cross section of the tapered tunnel 11 appears inverted U-shaped or U-shaped, the tapered tunnel 11 achieves the same effectiveness.

FIG. 6, and FIG. 7A to FIG. 7D show steps of a stamping method for the cooling fin structure 10 of the present invention. As shown by step a in FIG. 6 and in FIG. 7, a slit cutting operation is performed to cut two slits 14 substantially parallel to each other on a cooling fin 1, wherein the slit cutting operation is providing a tool to form the slits 14 by cutting on the cooling fin 1. Alternatively, as shown by step a in FIG. 6 and in FIG. 7B, an impression stamping operation is performed to cut two slits 14 substantially parallel to each other on a cooling fin 1, wherein the impression stamping operation is providing a stamper to stamp and form the slits 14 below the cooling fin 1.

Figure 6:
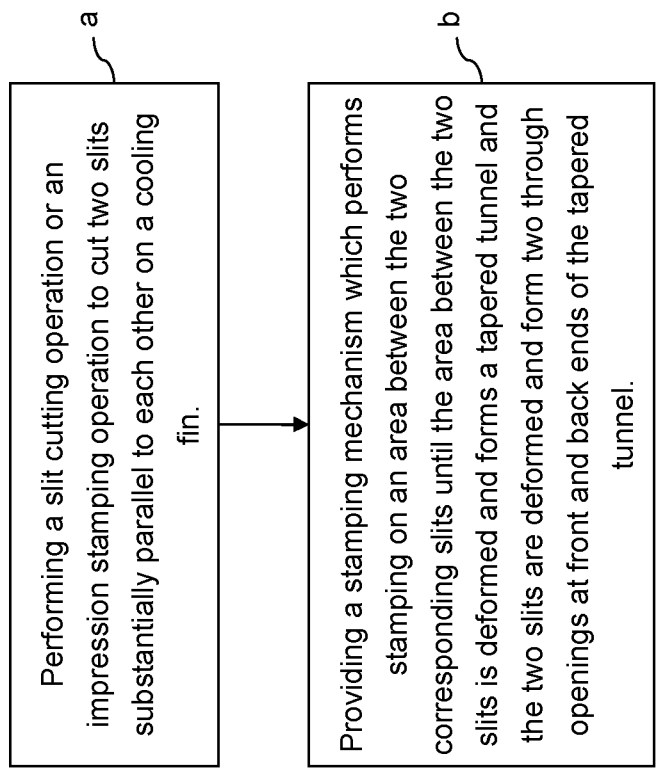
FIG. 6 is a flowchart of steps of a stamping method for the cooling fin structure of the present invention.
Figure 7A:
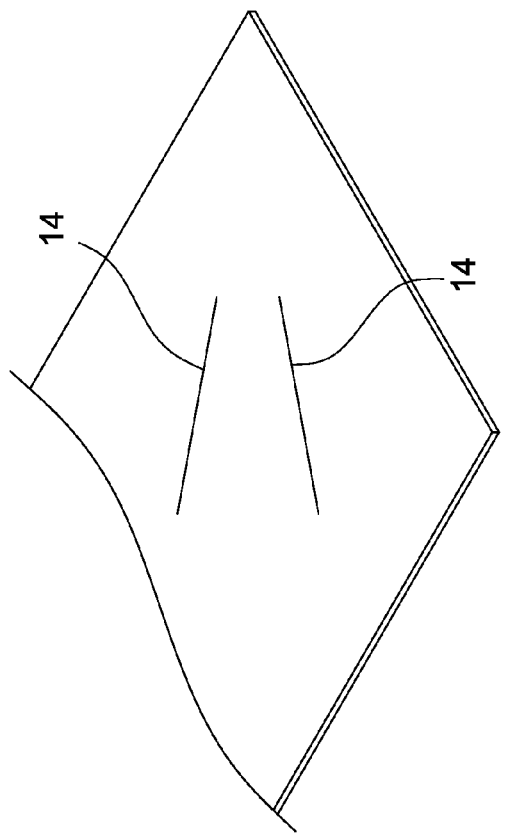
FIG. 7A is a schematic diagram of performing a slit cutting operation to cut two slits on a cooling fin of the present invention.
Figure 7B:
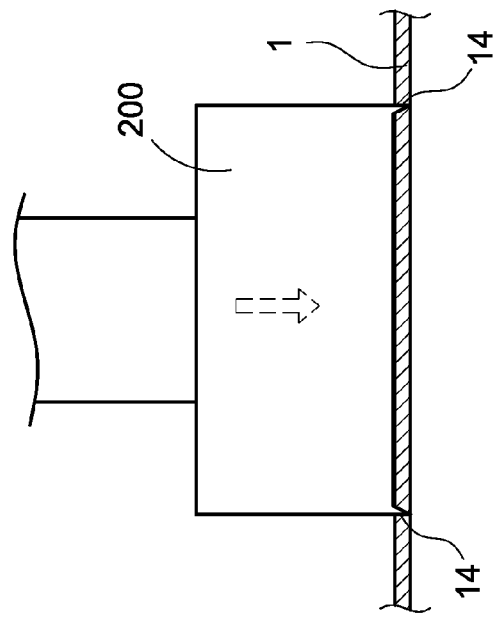
FIG. 7B is a schematic diagram of performing a slit cutting operation to cut two slits on a cooling fin of the present invention.
Figure 7D:
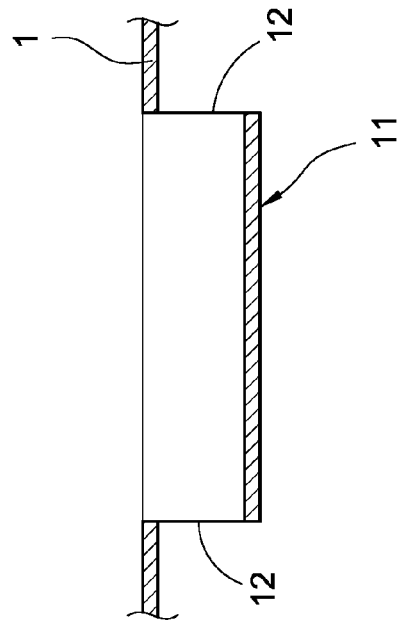
FIG. 7D is a schematic diagram of the area between the two slits becoming deformed and forming a tapered tunnel and the two slits becoming deformed and forming two through openings of the present invention.
Figure 7C:
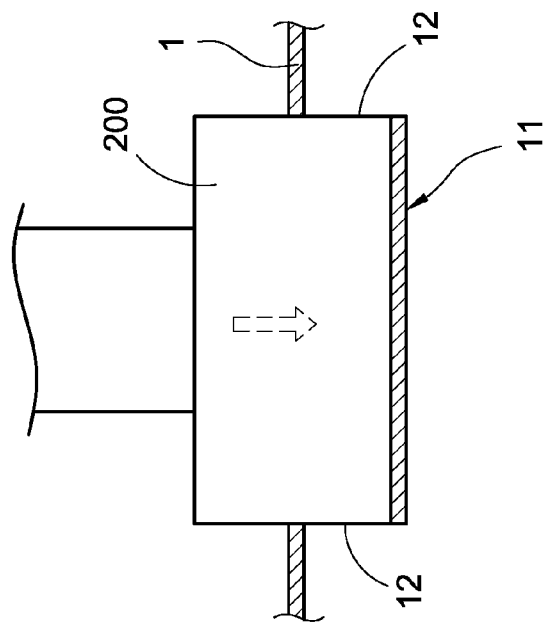
FIG. 7C is a schematic diagram of a stamping mechanism performing stamping on an area between the two corresponding slits of the present invention.

Furthermore, as shown by step b in FIG. 6, FIG. 7C and FIG. 7D, a stamping mechanism 200 is provided, and the stamping mechanism 200 performs stamping on an area between the two corresponding slits 14 until the area between the two slits 14 is deformed and forms a tapered tunnel 11, and the two slits 14 are deformed and form two through openings 12 at front and back ends of the tapered tunnel 11, thereby forming the cooling fin structure 10 in FIG. 1 to FIG. 6.

Figure 8:
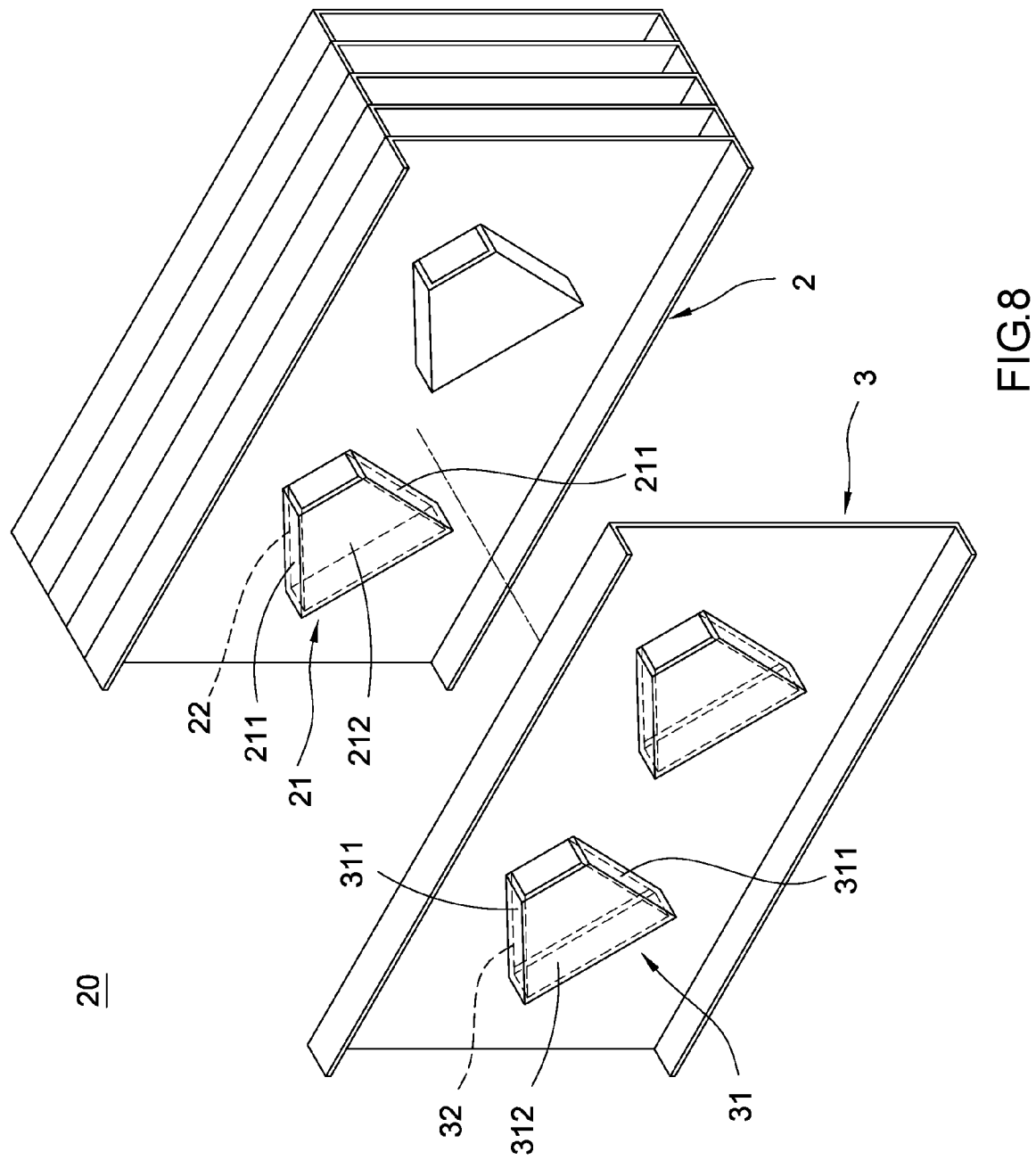
FIG. 8 is a schematic perspective view of an enhanced heat dissipation module according to the first embodiment of the present invention.
Figure 10:
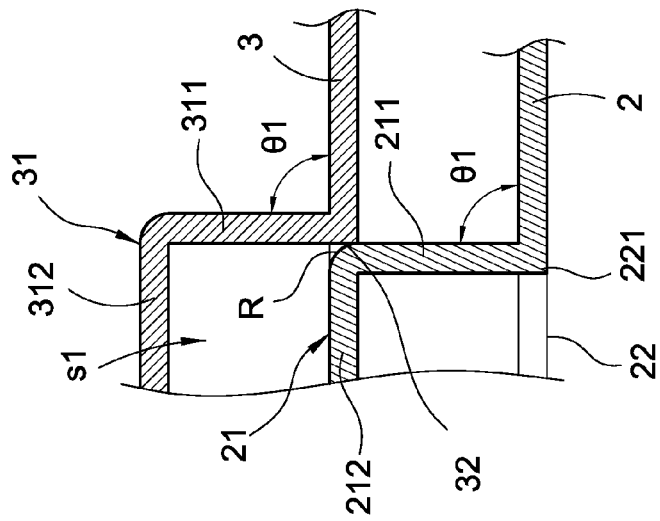
FIG. 10 is an enlarged partial section view of the enhanced heat dissipation module according to the first embodiment of the present invention.
Figure 9:
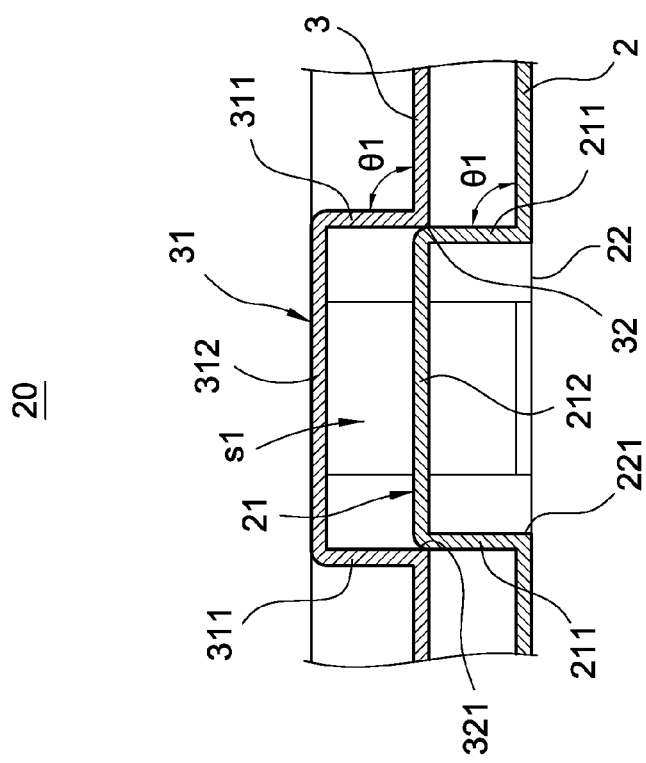
FIG. 9 is a schematic section view of the enhanced heat dissipation module according to the first embodiment of the present invention.

FIG. 8 to FIG. 10 show an enhanced heat dissipation module 20 according to the first embodiment of the present invention. Referring to FIG. 8 to FIG. 10, the enhanced heat dissipation module 20 primarily includes a first cooling fin 2 and a second cooling fin 3.

As shown in FIG. 8 and FIG. 9, the first cooling fin 2 includes one or more first tapered tunnels 21 protruding outwards. The first tapered tunnel 21 has two side walls 211 and an upper wall 212. The upper wall 212 extends integrally and bridges the two side walls 211. A cross section of the first tapered tunnel 21 is inverted U-shaped. A right angle θ1 is formed between each of the side walls 211 and the upper wall 212. The first cooling fin 2 is provided with one or more windows 22, each of which has two opposite sides 221. The two side walls 211 of each first tapered tunnel 21 integrally extend outwards from the two sides 221 of the window 22 of the respective first cooling fin 2, respectively.

As shown in FIG. 8 and FIG. 9, the second cooling fin 3 includes one or more second tapered tunnels 31 protruding outwards. The second tapered tunnel 31 has two side walls 311 and an upper wall 312. The upper wall 312 extends integrally and bridges the two side walls 311. A cross section of the second tapered tunnel 31 is inverted U-shaped. A right angle θ1 is formed between each of the side walls 311 and the upper wall 312. The second cooling fin 3 is provided with one or more windows 32, each of which has two opposite sides 321. The two side walls 311 of each second tapered tunnel 31 integrally extend outwards from the two sides 321 of the window 32 of the respective second cooling fin 3, respectively. The first tapered tunnel 21 and the second tapered tunnel 31 jointly encircle and form a flow guide channel s1, and extend and are formed towards the same side.

Detailed description is given below. The upper wall 212 of the first tapered tunnel 21 in this embodiment bridges the window 32 provided at the second cooling fin 3 corresponding in position to the second tapered tunnel 31, so as to jointly encircle and form the flow guide channel s1.

As shown in FIG. 10, a fillet or a chamfer is provided at a connecting position of the side wall 211 and the upper wall 212 in the first tapered tunnel 21 in this embodiment, so as to enable the upper wall 212 of the first tapered tunnel 21 to readily embed in the window 32 provided at the second cooling fin 3 corresponding in position to the second tapered tunnel 31.

As shown in FIG. 8 to FIG. 10, in a use state of the enhanced heat dissipation module 20 of the present invention, the first tapered tunnel 21 and the second tapered tunnel 31 jointly encircle and form a flow guide channel s1. When hot air passes upwards through the flow guide channel s1, due to the gradually reducing openings of the first tapered tunnel 21 and the second tapered tunnel 31, a pressure difference is generated as the air pressure below is greater than the air pressure above, and high temperature moves towards low temperature, thereby enhancing natural thermal convection, and achieving enhanced heat dissipation efficiency of the enhanced heat dissipation module 20.

Furthermore, the surface area of the first tapered tunnel 21 is approximately 10% of the surface area of the first cooling fin 2, and the surface area of the second tapered tunnel 31 is approximately 10% of the second cooling fin 3, providing the enhanced heat dissipation module 20 with more surface area for heat dissipation, and enabling the surfaces of the first cooling fin 2 and the second cooling fin 3 to enhance heat dissipation performance of thermal radiation without involving additional coating material.

Figure 11:
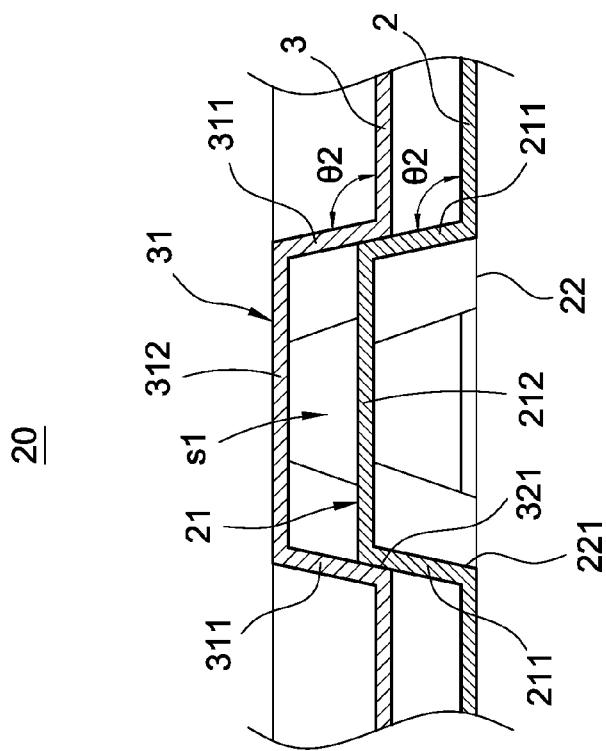
FIG. 11 is a schematic section view of the enhanced heat dissipation module according to the second embodiment of the present invention.

FIG. 11 shows the enhanced heat dissipation module 20 according to the second embodiment of the present invention. Referring to FIG. 11, the second embodiment is substantially the same as the first embodiment, and differs from the first embodiment in that, cross sections of the first tapered tunnel 21 and the second tapered tunnel 31 appear trapezoidal.

Further description is given below. An obtuse angle θ2 is formed between each of the side walls 211 and the upper wall 212 of the first tapered tunnel 21, and an obtuse angle θ2 is formed between each of the side walls 311 and the upper wall 312 of the second tapered tunnel 31, so as to enable the upper wall 212 of the first tapered tunnel 21 to embed in an interior of the second tapered tunnel 31 and the upper wall 212 of the first tapered tunnel 21 to bridge the two side walls 311 of the second tapered tunnel 31 to jointly encircle and form the flow guide channel s1. Accordingly, the function and effectiveness of the foregoing enhanced heat dissipation module 20 in the first embodiment are similarly achieved.

Figure 12:
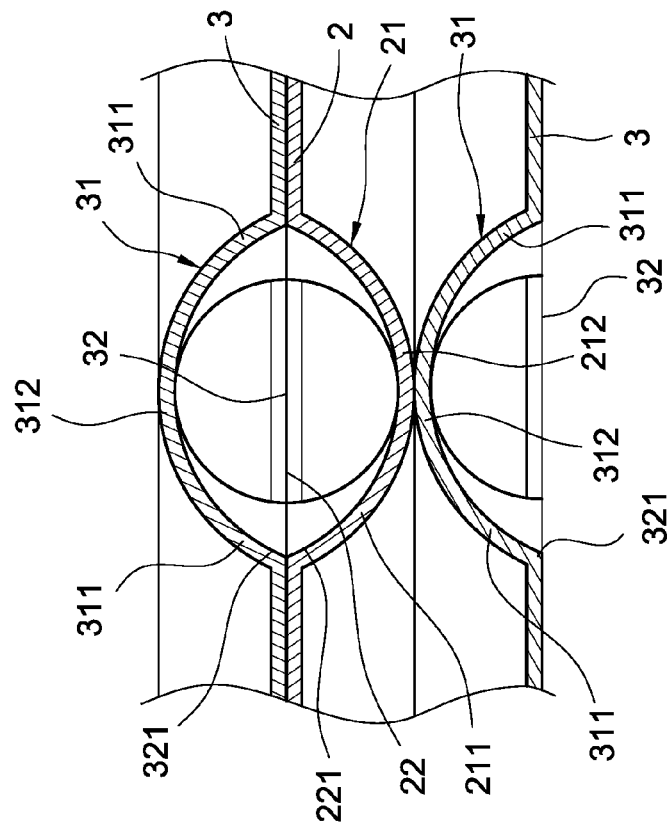
FIG. 12 is a schematic section view of the enhanced heat dissipation module according to the third embodiment of the present invention.

FIG. 12 shows the enhanced heat dissipation module 20 according to the third embodiment of the present invention. Referring to FIG. 12, the third embodiment is substantially the same as the first embodiment, and differs from the first embodiment in that, the first tapered tunnel 21 and the second tapered tunnel 31 extend and are formed towards opposite sides.

Detailed description is given below. The first tapered tunnel 21 and the second tapered tunnel 31 extend and are formed towards opposite sides, and the window 22 of the first cooling fin 2 and the window 32 of the second cooling fin 3 are arranged by facing each other, such that the first tapered tunnel 21 and the second tapered tunnel 31 jointly encircle and form a flow guide channel s1, thereby achieving the same function and effectiveness of the foregoing enhanced heat dissipation module 20 in the first embodiment.

Furthermore, the first tapered tunnel 21 and the second tapered tunnel 31 in this embodiment are trapezoidal tunnels, and cross sections thereof appear, for example but not limited to, U-shaped. The first tapered tunnel 21 and the second tapered tunnel 31 may be trapezoidal tunnels or semi-ellipsoidal tunnels, and cross sections thereof may appear U-shaped or inverted U-shaped.

Figure 13:
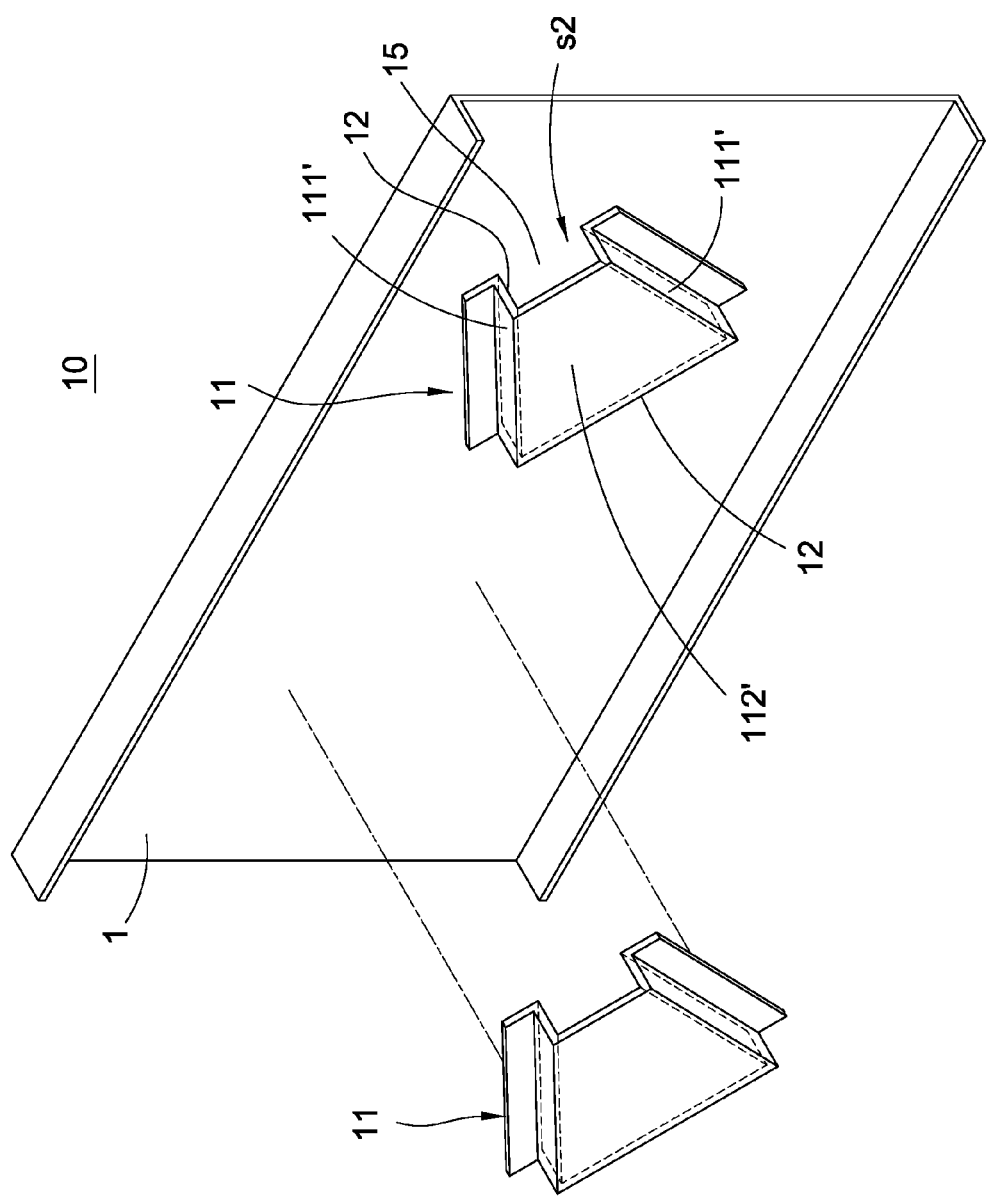
FIG. 13 is a schematic perspective view of the cooling fin structure according to the fourth embodiment of the present invention.

FIG. 13 shows the cooling fin structure 10 according to the fourth embodiment of the present invention. Referring to FIG. 13, the fourth embodiment is substantially the same as the first embodiment, and differs from the first embodiment in that, two side walls 111' of the tapered tunnel 11 are connected on the cooling fin 1.

Further description is given below. The two side walls 111' of the tapered tunnel 11 in this embodiment are, for example but not limited to, welded on the cooling fin 1. The two side walls 111' of the tapered tunnel 11 may also integrally extend outwards from the cooling fin 1.

In addition, an enclosed lower wall 15 is formed below an upper wall 112' of the cooling fin 1, and the upper wall 112', the two side walls 111' and the enclosed lower wall 15 jointly encircle and form a flow guide channel s2. Accordingly, when hot air passes upwards through the flow guide channel s2, due to the gradually reducing opening of the tapered tunnel 11, a pressure difference is generated as the air pressure below is greater than the air pressure above, and high temperature moves towards low temperature, thereby enhancing natural thermal convection, and achieving the same function and effectiveness of the foregoing cooling fin structure 10 in the first embodiment.

Figure 14:
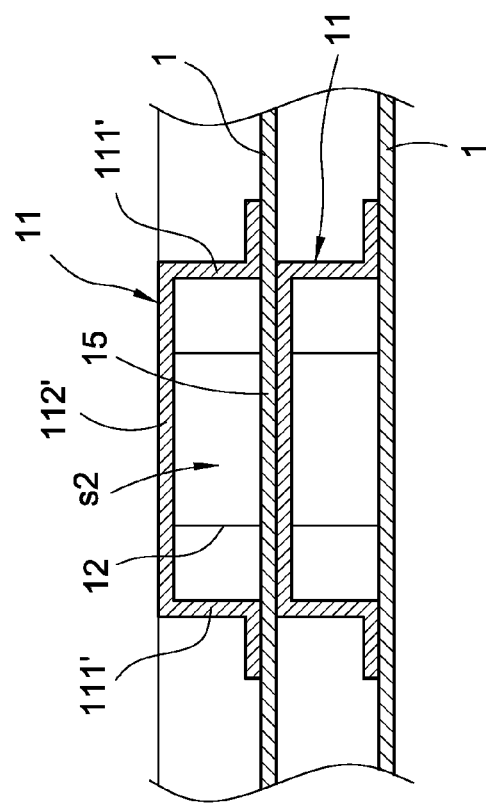
FIG. 14 is a schematic section view of the cooling fin structure according to the fifth embodiment of the present invention.
Figure 15:
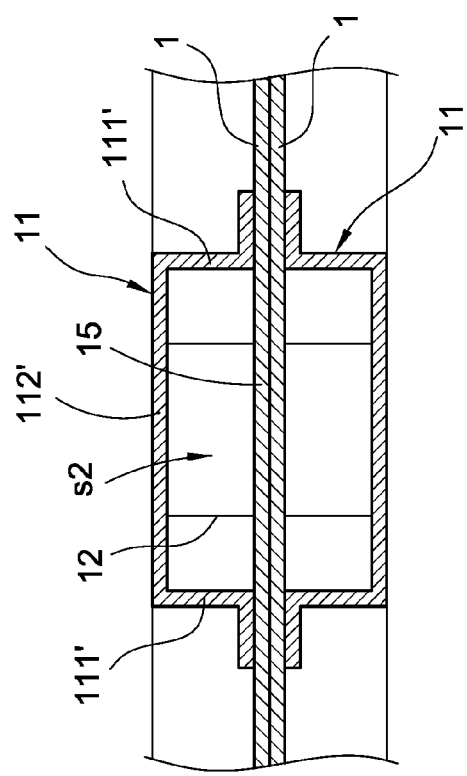
FIG. 15 is a schematic perspective view of the cooling fin structure according to the sixth embodiment of the present invention.

FIG. 14 and FIG. 15 show the cooling fin structure 10 according to the fifth and sixth embodiments of the present invention. The fifth and sixth embodiments are substantially the same as the fourth embodiment, and differ from the fourth embodiment in that the quantity of the cooling fin 1 is in plural.

Detailed description is given below. As shown in FIG. 14, a plurality of cooling fins 1 are arranged in layers side by side, and each of the tapered tunnels 11 extends and is formed towards the same side. As shown in FIG. 15, a plurality of cooling fins 1 are arranged in layers side by side, and each of the tapered tunnels 11 extends and is formed towards opposite sides. Accordingly, a pressure difference is generated when hot air passes upwards through the individual tapered tunnels 11, thereby achieving the same function and effectiveness of the foregoing cooling fin structure 10 in the fourth embodiment.

Figure 16:
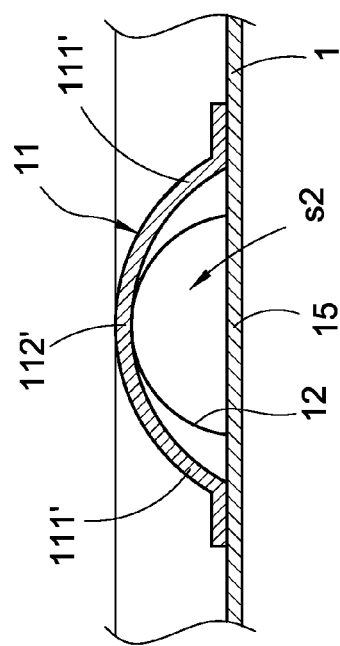
FIG. 16 is a schematic section view of the cooling fin structure according to the seventh embodiment of the present invention.

FIG. 16 shows the cooling fin structure 10 according to the seventh embodiment of the present invention. Referring to FIG. 16, the seventh embodiment is substantially the same as the fourth embodiment, and differs from the fourth embodiment in that the tapered tunnel 11 has a different shape.

Further description is given blow. A cross section of the tapered tunnel 11 in this embodiment is, for example but not limited to, U-shaped. The tapered tunnel 11 may be a trapezoidal tunnel or a semi-ellipsoidal tunnel, and the cross section of the tapered tunnel 11 may be inverted U-shaped or U-shaped.

In conclusion, the enhanced heat dissipation module, cooling fin structure and stamping method thereof of the present invention are not disclosed by similar products or public uses, and involve industrial applicability, novelty and an inventive step that completely comply with criteria for patent application. An application is filed hereby according to the Patent Law, and a request for granting of patent rights after thorough examination is respectfully submitted so as to protect rights of the Applicant.

What is claimed is:

1. An apparatus, comprising:
 a heat source; and
 a cooling fin structure, comprising:
  a first cooling fin having at least one first tapered tunnel protruding outwards, wherein the first tapered tunnel has two first side walls and a first upper wall, and the first upper walls extends integrally and bridges the two first side walls; and
  a second cooling fin having at least one second tapered tunnel protruding outwards, wherein the second tapered tunnel has two second side walls and a second upper wall, and the second upper walls extends integrally and bridges the two second side walls;
 wherein the two first side walls and first upper wall of the first tapered tunnel and the second upper wall of the second tapered tunnel jointly completely encircle and form a flow guide channel;
 wherein the first cooling fin and the second cooling fin are respectively provided with a first window and a second window, and each of the first window and the second window has two opposite sides, the two side walls of the first tapered tunnel integrally extend outwards from the two sides of the first window, respectively, and the two side walls of the second tapered tunnel integrally extend outwards from the two sides of the second window, respectively;
 wherein a right angle is respectively formed between the first side walls and the first upper wall and the second side walls and the second upper wall; and
 wherein one side of the cooling fin is in thermal contact with the heat source, and a first distance between the two first side walls and a second distance between the two second side walls gradually decreases towards a direction away from the heat source.

2. An enhanced heat dissipation module, comprising:

a first cooling fin having at least one first tapered tunnel protruding outwards, wherein the first tapered tunnel has two first side walls and a first upper wall, and the first upper walls extends integrally and bridges the two first side walls; and a second cooling fin having at least one second tapered tunnel protruding outwards, wherein the second tapered tunnel has two second side walls and a second upper wall, and the second upper walls extends integrally and bridges the two second side walls;

wherein the two first side walls and first upper wall of the first tapered tunnel and the second upper wall of the second tapered tunnel jointly completely encircle and form a flow guide channel;

wherein the first cooling fin and the second cooling fin are respectively provided with a first window and a second window, and each of the first window and the second window has two opposite sides, the two side walls of the first tapered tunnel integrally extend outwards from the two sides of the first window, respectively, and the two side walls of the second tapered tunnel integrally extend outwards from the two sides of the second window, respectively; and wherein a right angle is respectively formed between the first side walls and the first upper wall and the second side walls and the second upper wall.

* * * * *